United States Patent
Seo et al.

(10) Patent No.: US 12,118,166 B2
(45) Date of Patent: Oct. 15, 2024

(54) ELECTRONIC DEVICE INCLUDING NARROW BEZEL AND PROXIMITY SENSING METHOD FOR THE SAME

(71) Applicant: ABOV SEMICONDUCTOR CO., LTD., Cheongju-si (KR)

(72) Inventors: Young Jin Seo, Seoul (KR); Seok-Hyun Jee, Namyangju-si (KR); Seo Han Lee, Seoul (KR)

(73) Assignee: ABOV SEMICONDUCTOR CO., LTD., Cheongju-si (KR)

( * ) Notice: Subject to any disclaimer, the term of this patent is extended or adjusted under 35 U.S.C. 154(b) by 0 days.

(21) Appl. No.: 16/576,966

(22) Filed: Sep. 20, 2019

(65) Prior Publication Data
US 2020/0097108 A1    Mar. 26, 2020

(30) Foreign Application Priority Data
Sep. 20, 2018    (KR) .................. 10-2018-0113054

(51) Int. Cl.
  *G06F 3/044*    (2006.01)
  *G06F 3/01*    (2006.01)
  *G06F 3/041*    (2006.01)
  *H03K 17/955*    (2006.01)

(52) U.S. Cl.
  CPC .............. *G06F 3/044* (2013.01); *G06F 3/017* (2013.01); *G06F 3/0412* (2013.01); *G06F 3/0418* (2013.01); *H03K 17/955* (2013.01)

(58) Field of Classification Search
  CPC ........ G06F 3/044; G06F 3/017; G06F 3/0412; G06F 3/0418; H03K 17/955
  See application file for complete search history.

(56) References Cited

U.S. PATENT DOCUMENTS

| | | |
|---|---|---|
| 9,201,554 B2 | 12/2015 | Lee et al. |
| 9,733,745 B1* | 8/2017 | Kremin .................. G06F 3/044 |
| 9,736,701 B2 | 8/2017 | Forutanpour et al. |
| 10,268,305 B2 | 4/2019 | Kim et al. |
| 2012/0098783 A1* | 4/2012 | Badaye ................. G06F 3/0446 |
| | | 345/174 |

(Continued)

FOREIGN PATENT DOCUMENTS

| | | |
|---|---|---|
| KR | 10-2011-0034534 A | 4/2011 |
| KR | 10-2016-0143085 A | 12/2016 |
| KR | 10-2018-0061515 A | 6/2018 |

*Primary Examiner* — Wing H Chow
(74) *Attorney, Agent, or Firm* — United One Law; Kongsik Kim; Jhonqwoo Peck

(57) ABSTRACT

Disclosed are an electronic device including a narrow bezel and a proximity sensing method for the electronic device. The electronic device includes: a first sensor configured to be arranged in a first area which is at least part of the non-display area of a front surface including a display, and to detect first capacitance between a first object in front of the front surface and the first sensor; a second sensor configured to be arranged in a first side surface adjacent to the first area, and to detect second capacitance between a second object in front of the first side surface and the second sensor; and a processor configured to generate sensing information by compensating the first capacitance based on the second capacitance, and to determine the proximity of the first object based on the sensing information.

8 Claims, 13 Drawing Sheets

(56) References Cited

U.S. PATENT DOCUMENTS

2015/0261364 A1\* 9/2015 Cady .................. G06F 3/04883
　　　　　　　　　　　　　　　　　　　　345/173
2016/0357317 A1　12/2016 Kim et al.
2017/0083135 A1\* 3/2017 Sheik-Nainar ........ G06F 3/0488

\* cited by examiner (a)  (b)

(a)

Unwanted proximity detection (ghost touch) may occur when an electronic device is placed on the desk.
(b)

(b)

(d)

(c)

(f)

ELECTRONIC DEVICE INCLUDING NARROW BEZEL AND PROXIMITY SENSING METHOD FOR THE SAME

CROSS-REFERENCE TO RELATED APPLICATION

This application claims under 35 U.S.C. § 119(a) the benefit of Korean Patent Application No. 10-2018-0113054 filed on Sep. 20, 2018, which is incorporated herein by reference.

TECHNICAL FIELD

The present invention relates generally to an electronic device including a narrow bezel and a proximity sensing method which is performed in the electronic device, and more specifically to a method which can sense the touch or proximity of a user without an error in an electronic device including a narrow bezel.

BACKGROUND ART

Smartphones which have been widely used recently can receive the touch input of users through touch screens. When a touch input of a user is close to such a touch screen within a preset distance, e.g., 5 cm, a corresponding smartphone can determine a location on the touch screen which corresponds to the touch input of the user.

Furthermore, the smartphone can detect the proximity of an object by using an internal infrared sensor. The infrared proximity sensor may include an infrared filter configured to pass only infrared rays therethrough on the transparent window glass of the smartphone for the purpose of the smooth emission of infrared rays from a light source and the reception of reflected infrared rays.

Although there are various methods for implementing a touch screen, a method using a capacitive touch sensor has been widely adopted recently. A method for detecting the proximity of an object by using both an infrared sensor and a capacitive touch sensor has been most frequently used.

The infrared sensor has a longer sensing distance than the capacitive touch sensor, and supplements the operation of the capacitive touch sensor by detecting the proximity of an object performed outside the sensing distance of the capacitive touch sensor or a gesture generated by the movement of an object.

For example, there may be a case where a user brings a smartphone to his or her face in order to make a call via the smartphone. In this case, when the smartphone is close to the face of the user, the user does not need to view the display of the smartphone, and thus it is preferable that the power of the display of the smartphone is cut off. The combination of the infrared sensor and the capacitive touch sensor provides the advantage of determining a state in which the user grips the smartphone or whether or not the smartphone is close to his or her face in order to make a call.

However, as shown in FIG. 1, a proximity sensor using an infrared sensor requires an emitter 102 and a detector 101, and independent spaces need to be allocated to the emitter 102 and the detector 101 in order to prevent the emitter 102 and the detector 101 from interfering with each other. As described above, the configuration of the infrared proximity sensor imposes a constraint in which it is difficult to reduce the area of the front surface when the front surface of the electronic device is designed.

As shown in FIGS. 1 and 2, recently, in order to increase the display area 103 of a mobile phone, the width of a bezel 120, which is a non-display area, has been narrowed. An active sensor, such as an infrared sensor, needs to be provided with a light source configured to emit infrared rays, and an independent space 110a needs to be allocated to the active sensor. Accordingly, in a narrow bezel or bezel-less design, a space in which an active sensor, such as an infrared sensor, can be disposed is further insufficient. In other words, the width of the bezel 120 is narrowed due to the extension of the display area 103 of the mobile device, and it becomes further difficult to secure the independent space 110a corresponding to the area 110 of an existing proximity/ambient light sensor within the bezel 120.

Korean Patent Application Publication No. 10-2016-0143085 entitled "Electronic Device and Control Method of Electronic Device" discloses a method in which a proximity sensor which replaces an infrared sensor is implemented inside a touch screen in an embedded form, the proximity sensor detects the proximity of an object to a touch screen area in an early stage, and an accurate location and the movement of an object are detected using the touch screen.

In this related art, multi-plate shaped capacitive proximity sensors are implemented by forming a separate layer on the rear surface of a touch screen within a display area. In this case, by connecting the multi-plate shaped capacitive proximity sensors in series, total capacitance becomes lower than the capacitance of each sensor in inverse proportion to the number of sensors, with the result that a component configured to increase a detectable distance to an object in proportion to the number of sensors is included.

This related art uses a method which utilizes the embedded layer formed in the wide display area and increases a detectable distance by using a wide area, and thus a problem arises in that detection efficiency is lowered when an approaching object does not have a wide area. An additional problem arises in that manufacturing cost increases when the number of elements of the sensor layer embedded in the display area is large.

Meanwhile, in line with a growing trend toward narrow bezel or bezel-less design, Korean Patent Application Publication No. 10-2018-0061515 entitled "Device for Preventing Erroneous Touch Operation by using Rear Surface Sensor of Mobile Device Employing Bezel-less Touch Screen" proposes a method in which a state in which a user grips a mobile phone is detected using a rear surface sensor in the mobile phone employing bezel-less design, it is determined whether a touch on a touch screen on a front surface is a touch actually intended by the user or a touch generated accidentally, and a phenomenon of being mistaken for a touch is prevented.

However, according to this related art, in order to distinguish various states in which a user grips a mobile phone, a plurality of rear surface sensors needs to be installed. The larger the space in which the rear surface sensors are disposed is, the smaller the space in which other parts are disposed in the rear surface is. Furthermore, additional problems arise in that power consumption is high because the touch screen on the front surface determines that the rear surface sensor simultaneously detects a grip in the state of having detected a touch input already and in that it is difficult to perform immediate processing because a conclusion is reached only through complicated/complexed pattern analysis.

SUMMARY OF THE DISCLOSURE

The present invention has been conceived to overcome the above-described problems of the related arts. Of the related arts, Korean Patent Application Publication No. 10-2016-0143085 entitled "Electronic Device and Control Method of Electronic Device" is configured such that both the touch screen on the front surface and the embedded proximity sensor detect capacitance in front of the front surface. The touch screen can perform precise location identification but has a short detectable distance, while the embedded proximity sensor increases a detectable distance but cannot perform precise location identification. Accordingly, a problem arises in that the two sensors need to be utilized to detect the same target (the proximity of an object to the front surface).

In Korean Patent Application Publication No. 10-2018-0061515 entitled "Device for Preventing Erroneous Touch Operation by using Rear Surface Sensor of Mobile Device Employing Bezel-less Touch Screen," which is another related art, the touch screen on the front surface and the proximity sensors on the side and rear surfaces are simply disposed or arranged, the proximity sensors on the side and rear surfaces do not influence the operation of the touch screen of the front surface, and the proximity detection performance of the sensors is not improved by the combination thereof. The individual sensors separately detect capacitance in front of the front surface (in the case of the touch screen) and capacitance in front of side and rear surfaces (in the case of the proximity sensors). Only after considering the detection results of all the sensors in an integrated manner, the gripping pattern of a user is identified, and whether to activate the operation of the touch screen is determined. Accordingly, problems arise in that power consumption is high and response speed is low.

An object of the present invention is to propose a method which, in an electronic device including a narrow bezel, prevents the erroneous operation of a proximity sensor disposed or arranged in a considerably small space and accurately identifies an intended touch or gesture operation of a user.

An object of the present invention is to propose a proximity sensor and proximity sensing method in which a ghost phenomenon of a proximity sensor attributable to the thickness of a considerably thin electronic device is eliminated in an electronic device including a narrow bezel.

An object of the present invention is to propose the disposition and structure of proximity sensors and a proximity sensing method in which, in an electronic device including a narrow bezel, the proximity sensors are efficiently disposed or arranged within a considerably small space and erroneous operation is prevented.

An object of the present invention is to propose a solution which performs effective proximity sensing in an electronic device including a narrow bezel by using a single capacitive proximity sensor/touch sensor circuit.

An object of the present invention is to propose a proximity sensing solution for an electronic device including a narrow bezel by using a single capacitive proximity sensor/touch sensor circuit which allows a free pattern electrode size and shape and easily supports multiple channels.

An object of the present invention is to provide a solution to the replacement of a conventional proximity sensor using an infrared ray with a capacitive proximity sensor, through which there is proposed a proximity sensing solution which can be effectively used in a mobile device having a narrow bezel and a slim design.

According to an aspect of the present invention, there is provided an electronic device including: a first sensor configured to be arranged in a first area which is at least part of the non-display area of a front surface including a display, and to detect first capacitance between a first object in front of the front surface and the first sensor; a second sensor configured to be arranged in a first side surface adjacent to the first area, and to detect second capacitance between a second object in front of the first side surface and the second sensor; and a processor configured to determine preliminarily the proximity of the first object based on the first capacitance, the processor generating sensing information by compensating the first capacitance based on the second capacitance and determining the proximity of the object based on the sensing information; wherein the first side surface is directed to a direction different from a direction to which the front surface including the display is directed.

The first sensor may include: a first electrode formed along a first direction included in the front surface; and a second electrode formed along a second direction included in the front surface and intersecting the first direction; and the second sensor may include: a third electrode formed along the first direction included in the first side surface, the first direction is also included in the front surface; and a fourth electrode formed along a third direction included in the first side surface and intersecting the first direction.

The processor may generate the sensing information based on the difference between the first capacitance and the second capacitance, or may generate the sensing information based on the ratio between the first capacitance and the second capacitance.

The processor may determine that there is no proximate object when the first capacitance is lower than a first threshold value, may generate the sensing information based on the first capacitance and the second capacitance when the first capacitance is equal to or higher than the first threshold value, may determine that the first capacitance results from noise when the sensing information is lower than a second threshold value, and may determine that the first object is proximate to the first sensor when the sensing information is equal to or higher than the second threshold value.

The electronic device may further include a third sensor. The third sensor may be arranged on a rear surface opposite to the front surface, and may detect third capacitance between a third object in front of the rear surface and the third sensor. The processor may compensate the sensing information based on the third capacitance.

The processor may determine that there is no proximate object when the sensing information is lower than a second threshold value, may compensate the sensing information based on the third capacitance when the sensing information is equal to or higher than the second threshold value, may determine that the sensing information before compensation results from noise when the compensated sensing information is lower than a third threshold value, and may determine that the first object is proximate to the first sensor when the compensated sensing information is equal to or higher than the third threshold value.

The processor may determine a coefficient, to which the second capacitance is applied, based on an environmental parameter when compensating the first capacitance based on the second capacitance, and the environmental parameter may be determined based on at least one of temperature, humidity, the area of the first sensor, and the area of the second sensor.

According to another aspect of the present invention, there is provided a proximity sensing method, the proximity sensing method being performed in an electronic device, the proximity sensing method including: a step of detecting, by a first sensor arranged in a first area which is at least part of the non-display area of a front surface including a display, first capacitance between a first object in front of the front surface and the first sensor; a step of detecting, by a second sensor arranged in a first side surface adjacent to the first area, second capacitance between the second object in front of the first side surface and the second sensor; a first determination step of determining preliminarily, by a processor within the electronic device, the proximity of the first object to the first sensor based on the first capacitance; a first compensation step of generating, by the processor, sensing information by compensating the first capacitance based on the second capacitance; and a second determination step of determining, by the processor, the proximity of the first object based on the sensing information; wherein the first side surface is directed to a direction different from a direction to which the front surface including the display is directed.

The first compensation step may include generating the sensing information based on the difference between the first capacitance and the second capacitance or generating the sensing information based on the ratio between the first capacitance and the second capacitance.

The first determination step may determine that there is no proximate object when the first capacitance is lower than a first threshold value. In this case the sensing information may be generated when the first capacitance is equal to or higher than the first threshold value. The second determination step may determine that the first capacitance results from noise when the sensing information is lower than a second threshold value. In this case, the first object is determined as proximate to the first sensor when the sensing information is equal to or higher than the second threshold value.

The proximity sensing method may further include: a step of detecting, by a third sensor arranged on a rear surface opposite to the front surface, third capacitance between a third object in front of the rear surface and the third sensor; and a second compensation step of compensating the sensing information based on the third capacitance.

The second determination step may determine that there is no proximate object when the sensing information is lower than a second threshold value. In this case, the sensing information may be compensated based on the third capacitance when the sensing information is equal to or higher than the second threshold value. The second determination step may determine that the sensing information before compensation results from noise when the compensated sensing information is lower than a third threshold value. In this case, the first object is proximate to the first sensor when the compensated sensing information is equal to or higher than the third threshold value.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

Objects of the present invention other than the above-described objects and features of the present invention will be apparent from the following description of embodiments given with reference to the accompanying drawings.

The embodiments of the present invention will be described in detail below with reference to the accompanying drawings. In the following description of the present invention, when it is determined that a detailed description of a well-known configuration or function related to the present invention may unnecessarily make the gist of the present invention obscure, the detailed description will be omitted.

Figure 1:
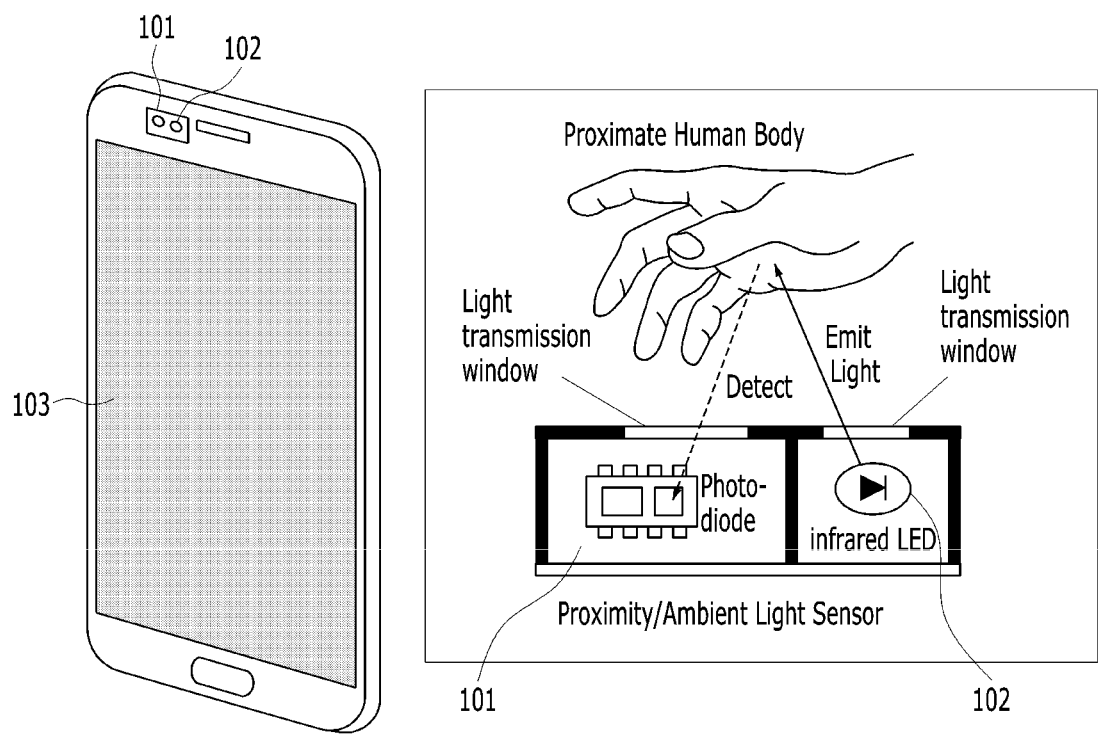
FIG. 1 is a view illustrating the disposition and operation of an infrared proximity sensor mounted in a conventional mobile electronic device.
Figure 2:
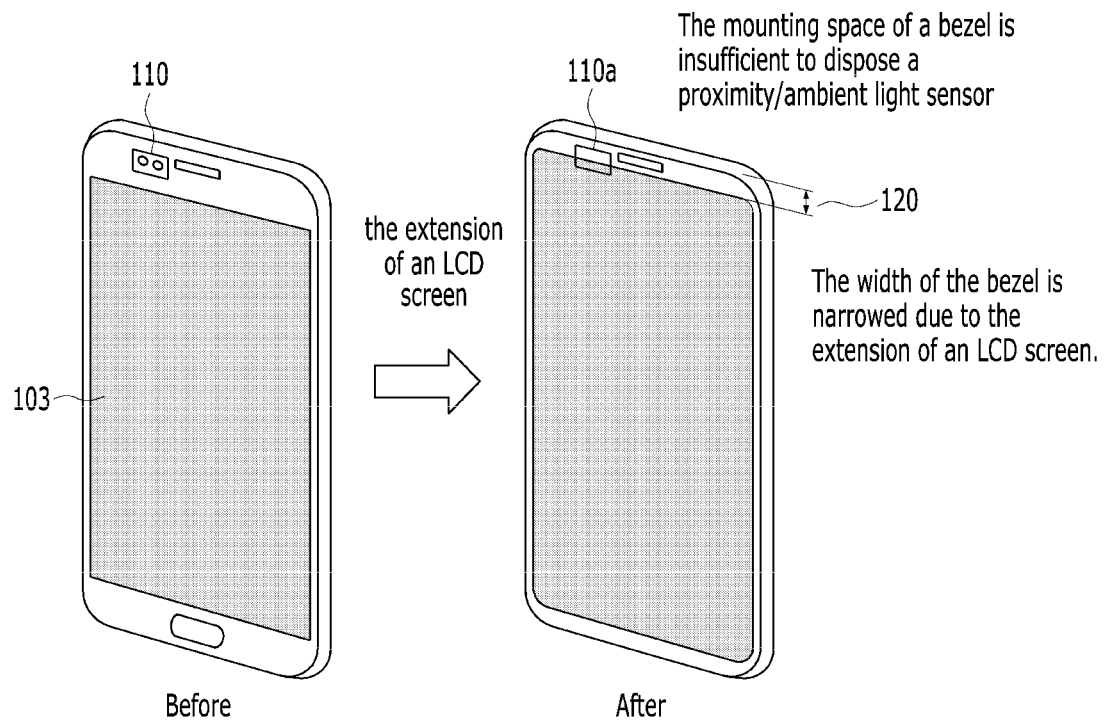
FIG. 2 is a view illustrating a case where, in a conventional mobile electronic device, the area of an LCD display is extended and the area of a bezel is reduced.

Although FIGS. 1 and 2 are drawings illustrating the related arts, the items required for the implementation of the present invention among the items described in conjunction with FIGS. 1 and 2 may be applied to both the present invention and the related arts in common. For example, when a human body (the face, a hand, or the like) comes close to the display area 103 of the mobile device in FIG. 1, the proximity/ambient light sensor detects this, and notifies an AP (the CPU of a mobile electronic device) of this. Thereafter, the AP turns off the display area 103 by cutting off the supply of power. In contrast, when the proximate human body moves away, the proximity/ambient light sensor detects this, and notifies the AP of this. The AP allows images to be output to a screen by resuming the supply of power to the display area 103.

In the following, a proximity sensor and a proximity detection method for the proximity sensor according to embodiments of the present invention will be described in detail below with reference to FIGS. 3 to 13.

Figure 3:
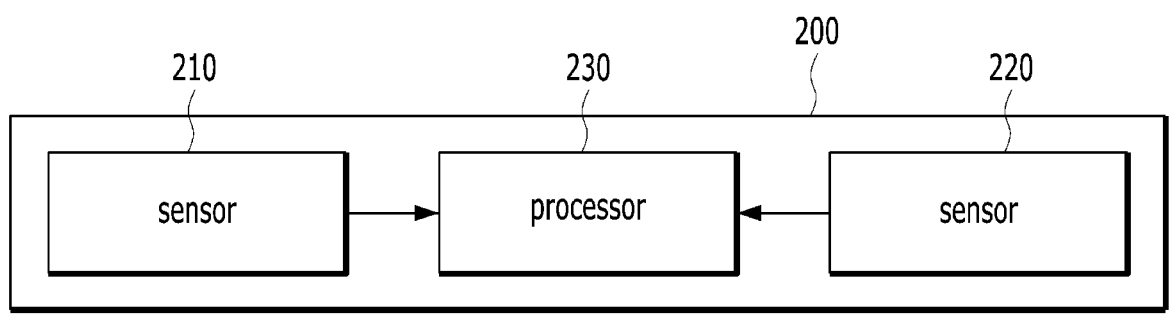
FIG. 3 is a block diagram showing the functional blocks of an electronic device including a narrow bezel according to one embodiment of the present invention.

FIG. 3 is a block diagram showing the functional blocks of an electronic device 200 including a narrow bezel according to one embodiment of the present invention.

The term "bezel" refers to all elements except for the portion where a screen is actually displayed when a smartphone, a tablet, or the like, which is a mobile communication electronic device, is viewed from the front. An electronic device includes not only a display but also parts configured to perform a plurality of functions, and also requires electronic parts configured to drive and control the display. For this reason, a non-display area in which a screen is not actually displayed is present on the edge of the peripheral portion of the display of an electronic device. A bezel area refers to such a non-display area.

As the demands of consumers for the reduction of a non-display area have been present and the technical problems requiring a wide bezel have been solved one by one, attempts to reduce the width of a bezel have been made. A narrow bezel width and/or a reduced bezel area mean that a large display area can be implemented for the same product size. As a result, the immersion level of a user can be increased, the mobility of the display can be improved by reducing the weight of the display, and the design constraints of the display can be significantly reduced.

Accordingly, the present invention is intended to propose a method which, in an electronic device including a narrow bezel, prevents the erroneous operation of a proximity sensor disposed or arranged in a considerably narrow space and accurately identifies an intended touch or gesture operation of a user.

Referring to FIG. 3, the electronic device 200 including a narrow bezel according to the embodiment of the present invention may include a first sensor 210, a second sensor 220, and a processor 230.

The first sensor 210 and the second sensor 220 are capacitive proximity sensors. The proximity sensor configured to detect the proximity of a human body in front thereof needs to be disposed or arranged toward the front due to its characteristics, and thus it is difficult to change the location of the proximity sensor. Recently, the width of a bezel has been narrowed, and thus the space where the proximity sensor is mounted has become insufficient. Accordingly, it is difficult to utilize an existing infrared proximity sensor or an ambient light sensor. The first sensor 210 is a proximity sensor capable of replacing such an existing infrared proximity sensor, and detects the proximity of a human body in front thereof. A measured capacitance value obtained by the second sensor 220 may be used to compensate a measured capacitance value detected by the first sensor 210.

The first sensor 210 is disposed or arranged within an area which is part of a bezel area, which is the non-display area of a front surface including a display. The first sensor 210 detects first capacitance between any object in front of the front surface of the display and the first sensor 210. Since the first sensor 210 is advantageous in that the first sensor 210 may be arranged in a free pattern depending on various electrode sizes and shapes according to the shape and size of the space of the bezel area where the first sensor 210 is arranged by using a single capacitance touch integrated circuit (IC) and may be supported in a multichannel manner without a limitation to the material of a conductor or the number of channels, an existing infrared proximity sensor, or an ambient light sensor may be replaced with the first sensor 210. For ease of description, the first capacitance refers to capacitance detected between any object in front of the front surface of the display in the electronic device 200 and the first sensor 210. When part of the human body of a user comes close to the electronic device 200, the value of the first capacitance is changed, and may be used as a means for detecting an event in which part of the human body of the user comes close to the electronic device 200.

When it is determined that the user brings his or her body (the face, a hand, or the like) close to the front surface of the display in order to make a call by using the electronic device 200 (which may be a mobile communication electronic device in this case) in such a manner that the first sensor 210 detects such a change in first capacitance, the electronic device 200 may save power by cutting off the power of the display.

When the human body (the face, a hand, or like) of the user comes close to the display within a predetermined distance in the direction of the front surface of the display to which the first sensor 210 is directed, the capacitance value of the first sensor 210 is increased, and the capacitance touch digital sensitivity counter value of the first sensor 210 is increased in proportion to the capacitance value. When the capacitance touch digital sensitivity counter value is equal to or larger than a threshold value, it is determined that proximity sensing has been detected in front of the front surface of the display. In this case, the electronic device 200 controls the operation of the display so that the output of the display can be turned off. Meanwhile, when the capacitance touch digital sensitivity counter value becomes lower than a threshold value, the electronic device 200 controls the operation of the display so that the output of the display can be turned on.

Since the bezel is narrowed, the first sensor 210 may be implemented within a relatively small space/area.

Furthermore, the bezel is narrowed, the location of the first sensor 210 may be limited to an area close to corners of the electronic device 200. This factor increases the possibility of an external disturbance factor intervening in the capacitance detection function of the first sensor 210. In the present invention, the proximity of an object can be accurately detected by compensating the first capacitance, detected by the first sensor 210, by using the second sensor 220 in order to be robust to the disturbance factor for the first sensor 210 and to accurately detect the proximity of the human body of the actual user.

The second sensor 220 may be disposed or arranged on a side surface adjacent to the bezel area of the front surface of the display where the first sensor 210 is arranged. The side surface where the second sensor 220 is arranged is directed to a direction different from the direction to which the front surface of the display of the electronic device 200 is directed. For example, the side surface where the second sensor 220 is arranged may be the upper side surface of the electronic device 200. The second sensor 220 may detect second capacitance in front of the upper side surface of the electronic device 200. The upper side surface where the second sensor 220 is arranged may be perpendicular to the front surface of the display of the electronic device 200.

The second capacitance is capacitance detected between any object in front of the side surface of the electronic device 200 and the second sensor 220, and may be used as a means for validating that proximity has actually occurred by compensating the first capacitance detected by the first sensor 210.

The second sensor 220 may be implemented using a single capacitance touch integrated circuit (IC) in the same manner as the first sensor 210. Since the second sensor 220 is advantageous in that the second sensor 220 may be arranged in a free pattern implementing various electrode sizes and shapes according to the shape and size of the space of the side surface where the second sensor 220 is arranged and may be supported in a multichannel manner without a limitation to the material of a conductor or the number of channels, the second sensor 220 meets the recent trend of the electronic device 200 in which the bezel thereof is narrowed and also the thickness thereof is decreased, and may be utilized as a capacitance-based proximity sensor.

Sensing information may be generated in such a manner that the processor 230 determines the proximity of an object based on the first capacitance measured by the first sensor 210 and the first capacitance is compensated based on the second capacitance measured by the second sensor 220, and the proximity of a human body or an object may be determined based on the sensing information.

The processor 230 may generate sensing information based on the difference between the first capacitance and the second capacitance, or may generate sensing information based on the ratio between the first capacitance and the second capacitance.

When the first capacitance is lower than the first threshold value, the processor 230 may determine that there is no proximate object. When the first capacitance is equal to or higher than the first threshold value, the processor 230 may determine preliminarily an object is proximate to the first sensor 210. If sensing information obtained based on the first capacitance and the second capacitance is lower than the second threshold value even when the first capacitance is equal to or higher than the first threshold value, the processor 230 may determine that the first capacitance results from noise though the first capacitance is preliminarily determined that an object is proximate to the first sensor 210. When the sensing information is equal to or higher than the second threshold value, the processor 230 may determine that an object is actually close to the first sensor 210. In this case, the first threshold value and the second threshold value may be optimized by considering variables upon design. In some embodiments, the same value may be applied as the first threshold value and the second threshold value.

Figure 4:
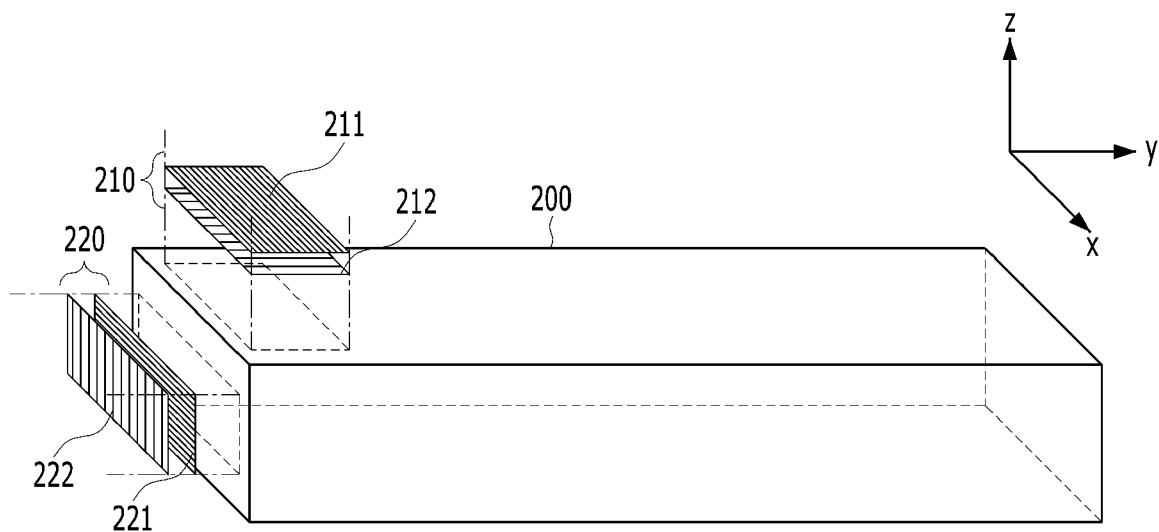
FIG. 4 is a view illustrating the electrode structures of the capacitance touch proximity sensors of the electronic device according to the embodiment of the present invention.

FIG. 4 is a view illustrating the electrode structures of the capacitance touch proximity sensors 210 and 220 of the electronic device 200 according to the embodiment of the present invention.

Referring to FIG. 4, the first sensor 210 may include: a first electrode 211 which is formed along a first direction (the x direction in the drawing) included in the front surface of a display; and a second electrode 212 which is formed along a second direction (the y direction in the drawing) included in the front surface and intersects the first direction.

The first electrode 211 and the second electrode 212 are insulated from each other by an insulating film. The first electrode 211 and the second electrode 212 may be closely attached but insulated from to each other by an optical adhesive film, such as a well-known optically clear adhesive (OCA) film, which is an example of the insulating film.

The first electrode 211 and the second electrode 212 are disposed or arranged to intersect each other, and thus a predetermined capacitance corresponding to the area of each intersection, i.e., a capacitance component, is present at each of the intersections of the first electrode 211 and the second electrode 212. When part of a human body comes close, a capacitance value may be changed because the area of the part of the human body is added to the area of an electrode, i.e., the first electrode 211, which is close to the part of a body which comes close. In this case, the second electrode 212 may be used as a drive line to which high-frequency current is provided. The first electrode 211 may be electrically influenced in response to the high-frequency current transferred to the second electrode 212, and thus current may be generated in the first electrode 211.

Accordingly, the capacitance between the first electrode 211 and the second electrode 212 may be changed depending on whether or not part of a human body is proximate. The processor 230 may determine the proximity of a human body by detecting such a change in an electrical characteristic.

The configurations of the first electrode 211 and the second electrode 212 may be implemented by referring to a plurality of documents, including, e.g., Korean Patent Application Publication No. 10-2011-0034534 entitled "Touch Panel Sensor using Grouped Fine Transparent Electrodes," which is another related art.

As shown in FIG. 4, the second sensor 220 may include: a third electrode 221 which is formed along the first direction (the x direction in the drawing) included in both the upper side surface of the electronic device 200 and the front surface; and a fourth electrode 222 which is formed along a third direction (the z direction in the drawing) included in the upper side surface of the electronic device 200 and intersecting the first direction.

Although an embodiment in which the front surface and upper side surface of the display of the electronic device 200 are perpendicular to each other is shown in FIG. 4, the spirit of the present invention is not limited thereto. Most of the front surface of the electronic device 200 is occupied by a display area, and only a limited narrow area is formed as a bezel. The first sensor 210 is disposed or arranged in the area of the bezel, and detects first capacitance indicating a proximity of any object in front of the front surface of a display. If the area of the bezel where the first sensor 210 is arranged is referred to as a first area for ease of description, the second sensor 220 is designed to detect parasitic capacitance which influences the capacitance value of the first sensor 210. The second sensor 220 is disposed or arranged toward the upper side surface of the electronic device 200 to detect second capacitance. In this case, the second sensor 220 is arranged on a side surface which is adjacent to the first area. In FIG. 4, there is shown an embodiment in which the first area of the bezel where the first sensor 210 is arranged is formed adjacent to the upper side surface and the second sensor 22 is arranged toward the upper side surface of the electronic device 200.

As shown in FIG. 4, both the first electrode 211 of the first sensor 210 and the third electrode 221 of the second sensor 220 are formed long toward the first direction (the x direction in the drawing). The first electrode 211 and the third electrode 221 may be designed to be disposed or arranged adjacent to each other to such an extent that the component of the first capacitance value of the first sensor 210 which is influenced by the parasitic capacitance on the upper side surface is detected by the second sensor 220, but may be designed not to be arranged excessively adjacent to each other to such an extent that crosstalk is induced.

The third electrode 221 and fourth electrode 222 of the second sensor 220 are insulated from each other in the same manner as in the first sensor 210. As described above, a specific process of implementing the second sensor 220 can be obtained from well-known technology.

Figure 5:
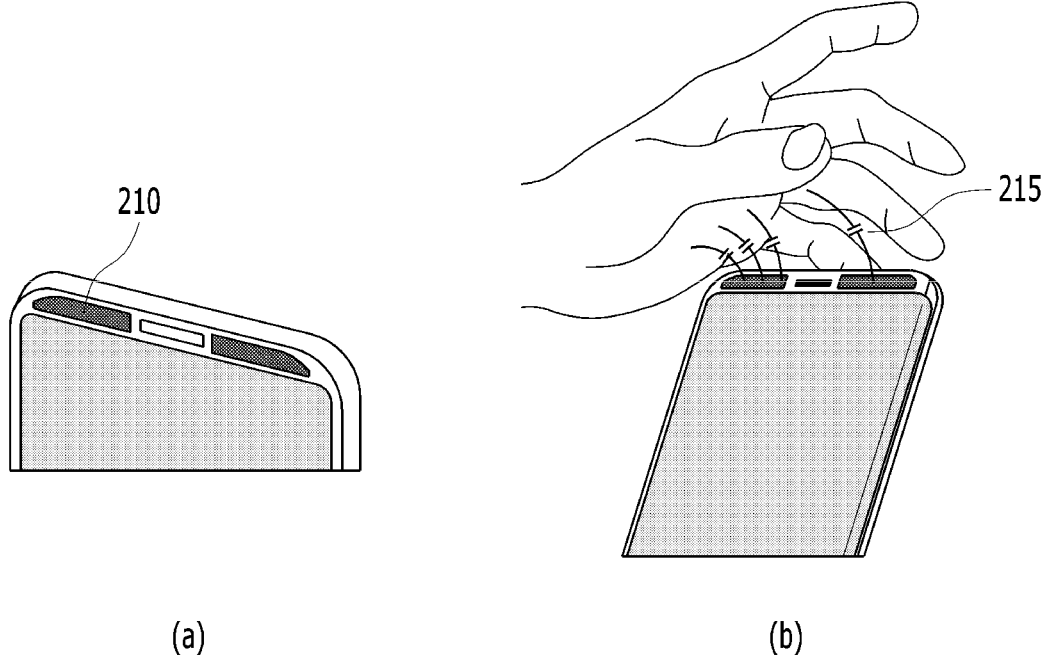
FIG. 5 show views illustrating the disposition and operation principle of a capacitive proximity sensor on the front surface of the display of the electronic device according to the embodiment of the present invention.

FIG. 5 show views illustrating the disposition and operation principle of a capacitive proximity sensor on the front surface of the display of the electronic device 200 according to the embodiment of the present invention. Furthermore, FIG. 6 is a view illustrating the operation of the capacitive proximity sensor on the front surface of the display of the electronic device according to the embodiment of the present invention.

Referring to FIG. 5(a), when an existing infrared proximity sensor or the like is replaced with the first sensor 210, which is a capacitive proximity sensor on the front surface of a display, while the width of a bezel at the upper end of the display is narrowed in order to extend the display, its pattern shape (width and length) has no limitations.

Accordingly, the capacitance pattern shape may be formed in accordance with the width the bezel, and the number of channels may be adjusted to one channel, two channels, three channels, or other multiple channels as desired.

Figure 6:
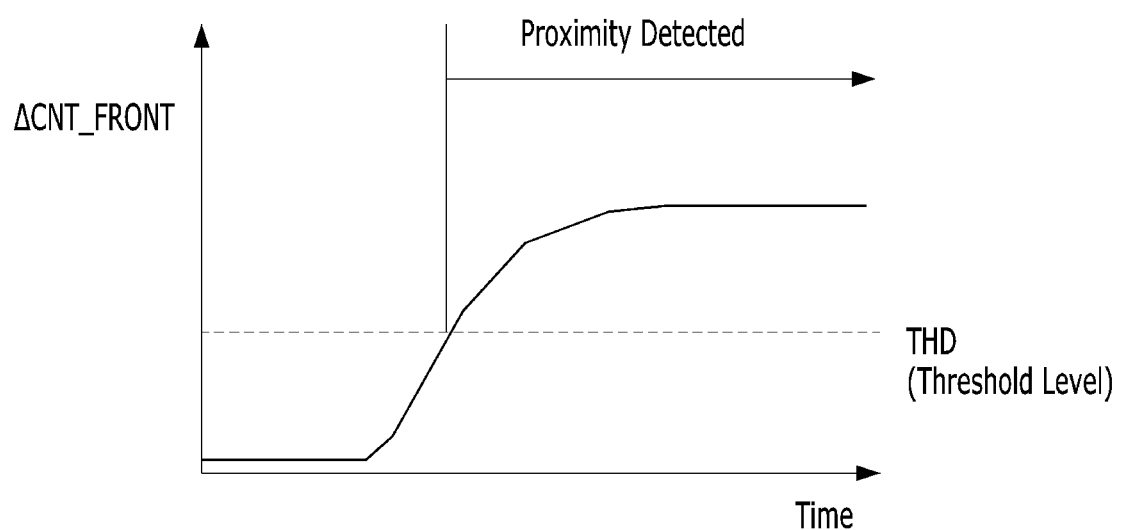
FIG. 6 is a view illustrating the operation of the capacitive proximity sensor on the front surface of the display of the electronic device according to the embodiment of the present invention.

Referring to FIGS. 5(b) and 6, when a body (the face, a hand, or the like) or an object comes close in the direction of the front surface of the display, the first capacitance 215 detected by the first sensor 210 is increased, and a capacitance touch sensitivity value ΔCNT_FRONT in proportion to the first capacitance 215. Furthermore, when the touch sensitivity value of the first sensor 210 is equal to or higher than a threshold value THD, the processor 230 determines that the proximity of the body or object is detected in the direction of the front surface of the display.

Figure 7:
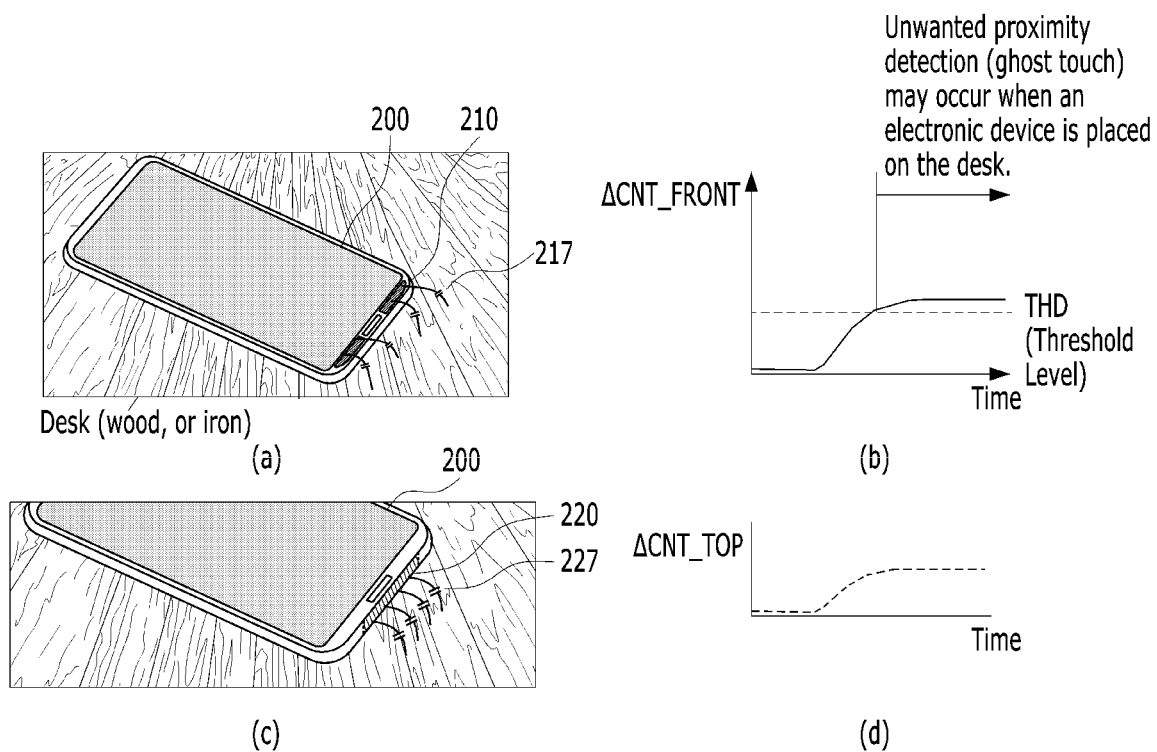
FIG. 7 is a view illustrating a principle by which a ghost touch phenomenon, which is the unwanted or erroneous detection of proximity, occurs and an example of a method for dealing with the ghost touch phenomenon, in the electronic device according to the embodiment of the present invention.

FIG. 7 is a view illustrating a principle by which a ghost touch phenomenon, which is the unwanted or erroneous detection of proximity, occurs and an example of a method for dealing with the ghost touch phenomenon, in the electronic device according to the embodiment of the present invention.

Ghost touch refers to a phenomenon in which the detection of a touch occurs in an unwanted condition, and also refers to an erroneous operation in which the processor 230 determines falsely that a user grips the electronic device 200 in order to use it and thus a body comes close thereto even when the user does not actually grip the electronic device 200 and then turns off the output of a display.

Referring to FIG. 7(a), when a user places the electronic device 200 on a desk made of a wood or iron material, first parasitic capacitance 217 may be formed between the pattern electrode of the first sensor 210, which is a proximity sensor directed toward the direction of the front surface of the display, and the desk made of a wood or iron material. In this case, referring to FIG. 7(b), the touch digital sensitivity value ΔCNT_FRONT of the first capacitance of the first sensor 210 may be increased above a threshold value THD in proportion to the first parasitic capacitance 217. In this case, even when the body of the user is not actually close to the electronic device 200, the body of the user is erroneously detected as coming close due to the first parasitic capacitance 217, which is a disturbance factor. This phenomenon is referred to as a ghost touch phenomenon, which is the unwanted, erroneous detection of proximity. In this case, when the processor 230 erroneously detects a user as coming close to the electronic device 200 to make a call, a problem may arise in that there occurs an erroneous operation in which the output of the display is turned off.

In order to overcome the above problem, a pattern electrode may be additionally disposed or arranged on a side surface of a display and/or the rear surface of the display other than the front surface of the display. For example, when the electronic device 200 is placed on a desk, capacitance is generated in each of the pattern electrodes on the front surface of the display and the side surface of the display and/or the rear surface of the display, and the capacitance touch digital sensitivity counter value of the pattern electrode is also increased.

In this case, when a value obtained by compensating the capacitance touch digital sensitivity counter value from the additional electrode based on the capacitance touch digital sensitivity counter value for the first sensor 210 of the front surface of the display is lower than a threshold value, it may be determined that the body of the user is not close to the electronic device 200. The present invention may prevent a ghost touch phenomenon from occurring by using this technique.

Referring to FIG. 7(c), the second capacitance detected by the second sensor 220 may include the second parasitic capacitance 227 which is generated between the direction of the upper side surface of the electronic device 200 where the second sensor 220 is arranged and a desk or adjacent object on which the electronic device 200 is placed when the electronic device 200 is placed on the desk or object. When the body of the user is not close, the second parasitic capacitance 227 prevails in the second capacitance detected by the second sensor 220. Referring to FIG. 7(d), there is shown a case where the second capacitance touch digital sensitivity value ΔCNT_TOP of the second sensor 220 is increased in proportion to an increase in the second parasitic capacitance 227.

As shown in FIG. 7(b) and FIG. 7(d), the first parasitic capacitance 217 and the second parasitic capacitance 227 may be changed in various manners depending on the material of a desk or adjacent object when the electronic device 200 is placed on the desk or object. In this case, the first sensor 210 and the second sensor 220 are arranged at adjacent locations, and thus the first parasitic capacitance 217 and the second parasitic capacitance 227 will be quantitatively closely related to each other due to the substantially same disturbance factor. Although an embodiment in which the first sensor 210 and second sensor 220 are arranged at adjacent locations to intersect each other at right angles is shown in FIGS. 7(a) and 7(c), the present invention is not limited thereto, and the direction in which the second sensor 220 is arranged may not be a direction perpendicular to the first sensor 210.

Figure 8:
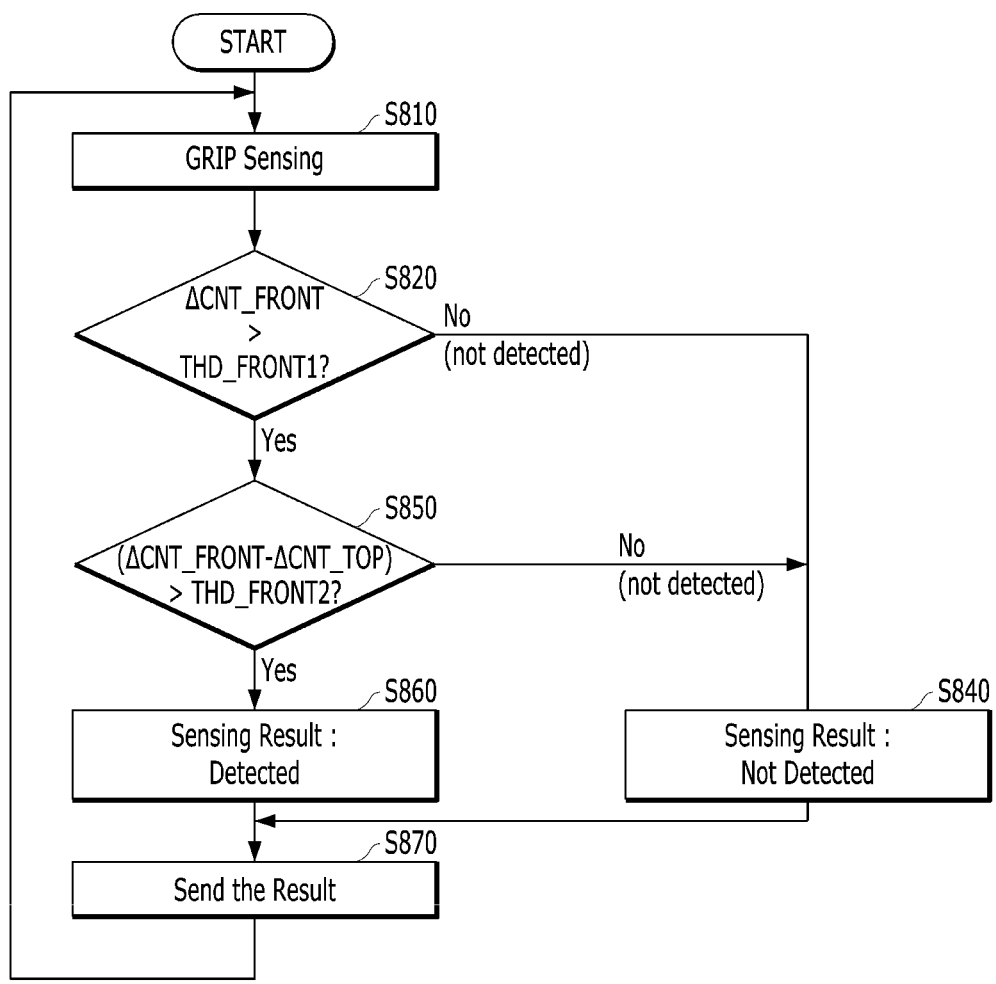
FIG. 8 is an operation flowchart showing a proximity sensing method for preventing a ghost touch phenomenon from occurring in the electronic device according to the embodiment of the present invention.

The processor 230 may generate proximity sensing information based on the difference between the first capacitance detected by the first sensor 210 and the second capacitance detected by the second sensor 220, or may generate proximity sensing information based on the ratio between the first capacitance and the second capacitance. The first parasitic capacitance 217 and the second parasitic capacitance 227 are canceled by quantitative compensation using the arithmetic operation of the first capacitance and the second capacitance, and thus proximity sensing information robust to a ghost touch phenomenon or other disturbance factors can be obtained. FIG. 8 is an operation flowchart showing a proximity sensing method for preventing a ghost touch phenomenon from occurring in the electronic device 200 according to the embodiment of the present invention.

Referring to FIG. 8, the first sensor 210 detects first capacitance and the second sensor 220 detects second capacitance at step S810.

The processor 230 detects the proximity of an object based on the touch sensitivity value ΔCNT_FRONT of the first capacitance at step S820. More specifically, when the touch sensitivity value ΔCNT_FRONT of the first capacitance is lower than a first threshold value THD_FRONT1, the processor 230 determines that there is no proximate object at step S840. In contrast, when the touch sensitivity value ΔCNT_FRONT of the first capacitance is equal to or higher than the first threshold value THD_FRONT1, the processor 230 may perform a first compensation step (not shown) for the touch sensitivity value ΔCNT_FRONT of the first capacitance by using the touch sensitivity value ΔCNT_TOP of the second capacitance, and may generate first compensated sensing information (ΔCNT_FRONT−ΔCNT_TOP).

The processor 230 may determine that the first capacitance results from noise or a disturbance factor at step S840 when the first compensated sensing information (ΔCNT_FRONT−ΔCNT_TOP) is lower than a second threshold value THD_FRONT2 at step S850, and may determine that a body or object is proximate to the first sensor 210 at step S860 when the sensing information (ΔCNT_FRONT−ΔCNT_TOP) is equal to or higher than the second threshold value THD_FRONT2. The processor 230 may transmit proximity information having passed through step S860 to an AP at step S870.

In this case, when compensating the first capacitance based on the second capacitance, the processor 230 determines a coefficient, to which the second capacitance is applied, based on an environmental parameter. The environmental parameter may be determined based on at least one of temperature, humidity, the area of the first sensor 210, and the area of the second sensor 220. In other words, the coefficient based on which the measured values of the first sensor 210 and the second sensor 220 are incorporated may be adjusted according to temperature, humidity, and/or the areas of the sensors.

Although an example in which the first compensated sensing information (ΔCNT_FRONT−ΔCNT_TOP) is obtained based on the difference between the touch sensitivity value ΔCNT_FRONT of the first capacitance and the touch sensitivity value ΔCNT_TOP of the second capacitance is shown in FIG. 8, sensing information compensated based on the ratio between the first capacitance and the second capacitance may be obtained in another embodiment of the present invention, as described above.

In FIG. 8, the first threshold value THD_FRONT1 and the second threshold value THD_FRONT2 may have different values or the same value depending on the embodiment.

Figure 9:
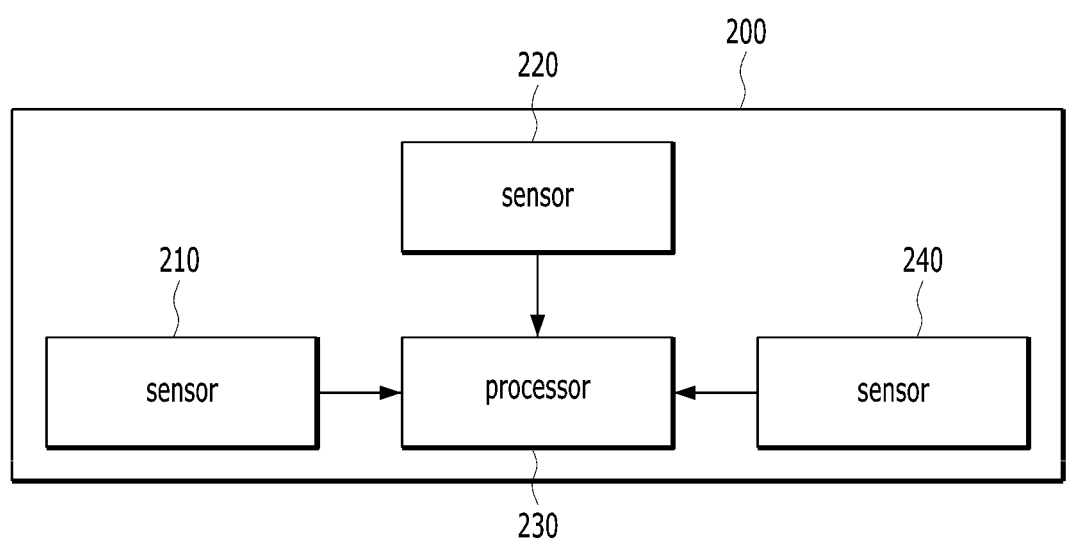
FIG. 9 is a block diagram showing the functional blocks of an electronic device including a narrow bezel according to another embodiment of the present invention.

FIG. 9 is a block diagram showing the functional blocks of an electronic device 200 including a narrow bezel according to another embodiment of the present invention. Furthermore, FIG. 10 is a view illustrating the electrode structures of the capacitive proximity sensors 210, 220 and 240 of the electronic device 200 including a narrow bezel according to the other embodiment of the present invention.

Referring to FIG. 9, the electronic device 200 including a narrow bezel according to the other embodiment of the present invention may include a first sensor 210, a second sensor 220, a third sensor 240, and a processor 230. Since the first sensor 210 and the second sensor 220 are the same as described above in conjunction with FIG. 3, descriptions thereof will be omitted. The third sensor 240 is disposed or arranged on the rear surface of a display opposite to the front surface of the display, and may detect third capacitance formed toward the rear surface.

The processor 230 may determine preliminarily the proximity of an object based on first capacitance detected by the first sensor 210, may generate sensing information by compensating the first capacitance based on third capacitance detected by the third sensor 240, and may determine finally the proximity of the object to the first sensor 210 based on the sensing information.

Figure 10:
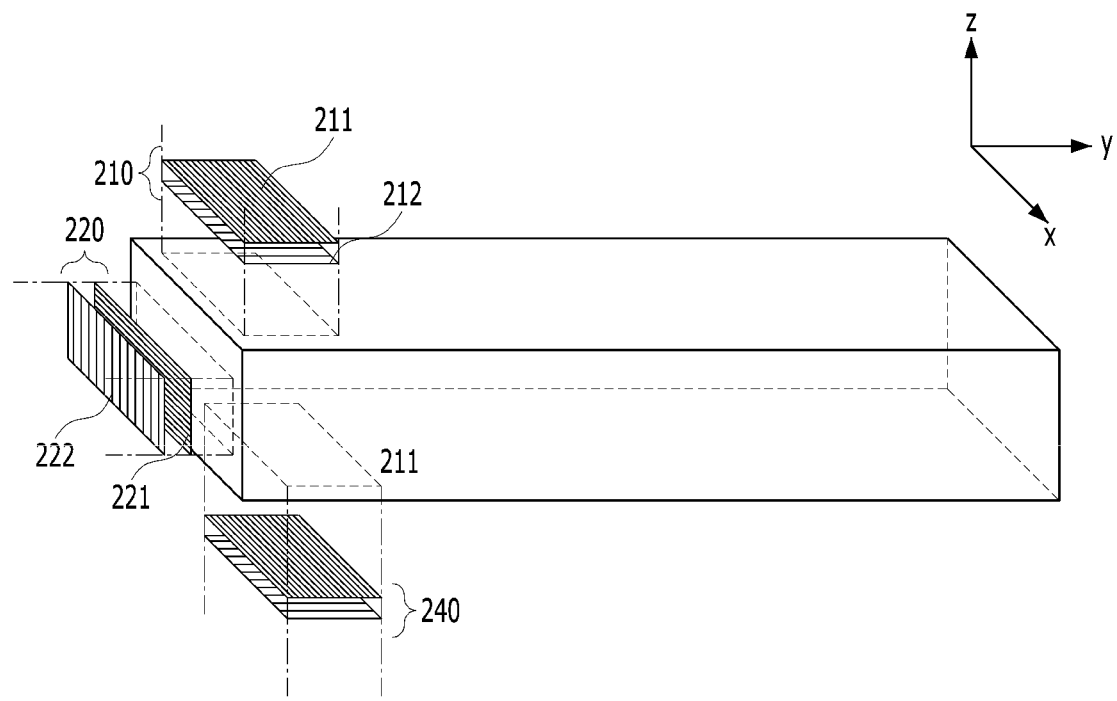
FIG. 10 is a view illustrating the electrode structures of the capacitive proximity sensors of the electronic device including a narrow bezel according to the other embodiment of the present invention.

Referring to FIG. 10, as described above in conjunction with FIG. 4, the third sensor 240 also includes: an electrode which is formed along a first direction (the x direction) included in the rear surface; and another electrode which is formed along a second direction (the y direction) included in the rear surface and intersecting the first direction. For detailed technology for the electrodes constituting the third sensor 240, reference may be made to Korean Patent Application Publication No. 10-2011-0034534, as described above in conjunction with FIG. 4.

Figure 11:
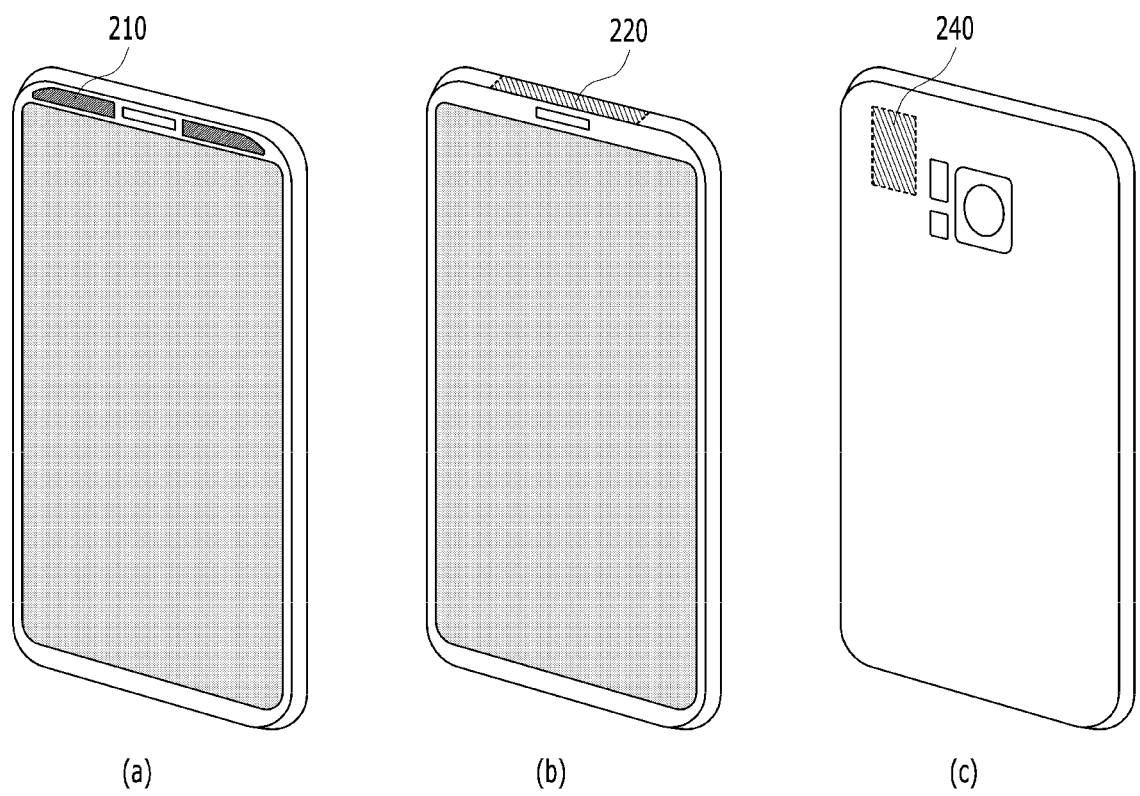
FIG. 11 is a view illustrating the disposition of the proximity sensors for preventing a ghost touch phenomenon, which is the unwanted or erroneous detection of proximity, from occurring in the electronic device according to the other embodiment of the present invention.

FIG. 11 is a view illustrating the disposition of the proximity sensors 210, 220 and 240 for preventing a ghost touch phenomenon, which is the unwanted or erroneous detection of proximity, from occurring in the electronic device according to the other embodiment of the present invention.

Referring to FIG. 11(*a*), an area in which there is formed the first sensor 210, which is a capacitive proximity sensor arranged in the direction of the front surface of a display, is emphasized and shown while the width of the bezel of an upper end portion is narrowed in order to extend the display in the electronic device 200.

In FIG. 11(*b*), an area in which there is formed the second sensor 220, which is adjacent to the first sensor 210, i.e., a capacitive proximity sensor, and is arranged on the upper side surface of the electronic device 200, i.e., a direction different from the direction of the front surface of the display, is emphasized and shown.

In FIG. 11(*c*), an area in which there is formed the third sensor 240, i.e., a capacitive proximity sensor arranged on the rear surface, which is opposite to the direction of the front surface of the display, is emphasized and shown. In the single electronic device 200, at least one of the second sensor 220 of FIG. 11(*b*) and the third sensor 240 of FIG. 11(*c*) may be implemented along with the first sensor 210 of FIG. 11(*a*).

Figure 12:
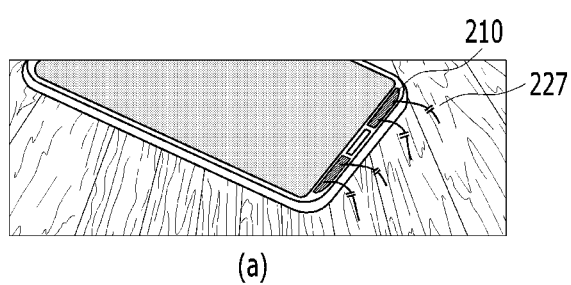
FIG. 12 is a view illustrating a principle by which a ghost touch phenomenon, which is the unwanted or erroneous detection of proximity, occurs and an example of a method for dealing with the ghost touch phenomenon, in the electronic device according to the other embodiment of the present invention.
Figure 12:
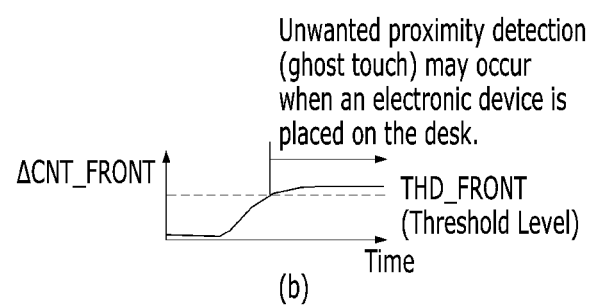
Figure 12:
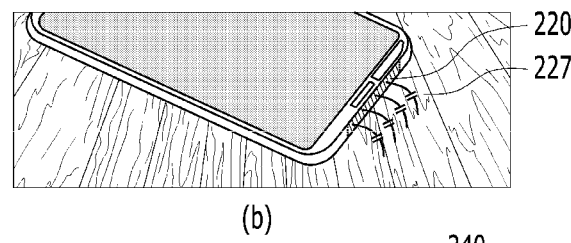
Figure 12:
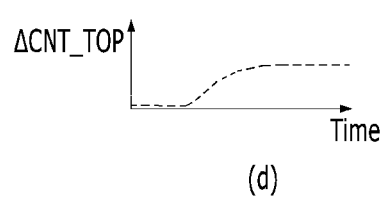
Figure 12:
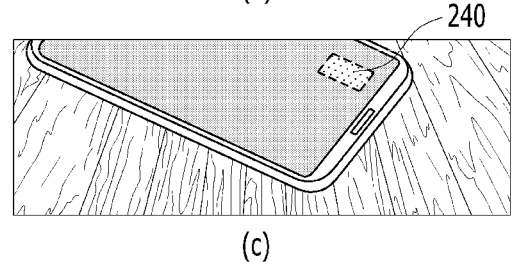
Figure 12:
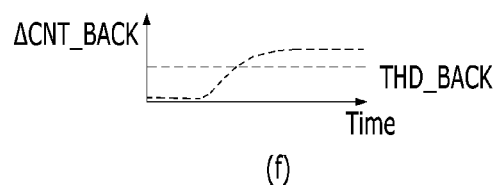

FIGS. 12(*a*) and 12(*b*) are views illustrating a principle by which a ghost touch phenomenon occurs, which is the unwanted or erroneous detection of proximity. FIGS. 12(*c*) through 12(*f*) are views illustrating an example of a method for dealing with the ghost touch phenomenon, in the electronic device according to the other embodiment of the present invention.

Referring to FIG. 12(*a*), when the electronic device 200 is placed on a desk made of a wood or iron material or the like, first parasitic capacitance 217 is formed between the first sensor 210, which is a capacitive proximity sensor in the direction of the front surface of the display and the desk made of a wood or iron material or the like.

Referring to FIG. 12(*b*), when the digital touch sensitivity value ΔCNT_FRONT of the first capacitance is increased above a threshold value THD in proportion to the first parasitic capacitance 217 of the first sensor 210, a ghost touch phenomenon, which is the unwanted detection of proximity, may occur.

Referring to FIG. 12(*c*), in this case, second parasitic capacitance 227 is formed between the second sensor 220, which is adjacent to the first sensor 210 of the electronic device 200 and which is provided on the upper side surface of the electronic device 200 in a direction different from the direction in which the first sensor 210 is arranged, and the desk made of a wood or iron material or the like. In other words, as shown in FIG. 12(*d*), the digital touch sensitivity value ΔCNT_TOP of the second capacitance is increased in proportion to the second parasitic capacitance 227 of the second sensor 220.

When the digital touch sensitivity value ΔCNT_BACK of the third capacitance of the third sensor 240 arranged on the rear surface of the display opposite to the direction of the front surface of the display is increased above a threshold value THD_BACK, the processor 230 may detect the proximity sensing of a body or object on the rear surface. However, referring to FIG. 12(*e*), in a state in which the electronic device 200 is placed on the desk, as shown in FIG. 12(*a*) and FIG. 12(*c*), the third capacitance detected by the third sensor 240 is highly influenced by third parasitic capacitance generated due to proximity to the desk made of a wood or iron material or the like. Referring to FIG. 12(*f*), the touch sensitivity value ΔCNT_BACK of the third capacitance of the third sensor 240 is increased in proportion to the third parasitic capacitance. Since the third parasitic capacitance has the significantly strong possibility of resulting from the first parasitic capacitance 217 and the second parasitic capacitance 227, the third parasitic capacitance has the strong possibility of being significantly closely and quantitatively related with the first parasitic capacitance 217 and the second parasitic capacitance 227.

Figure 13:
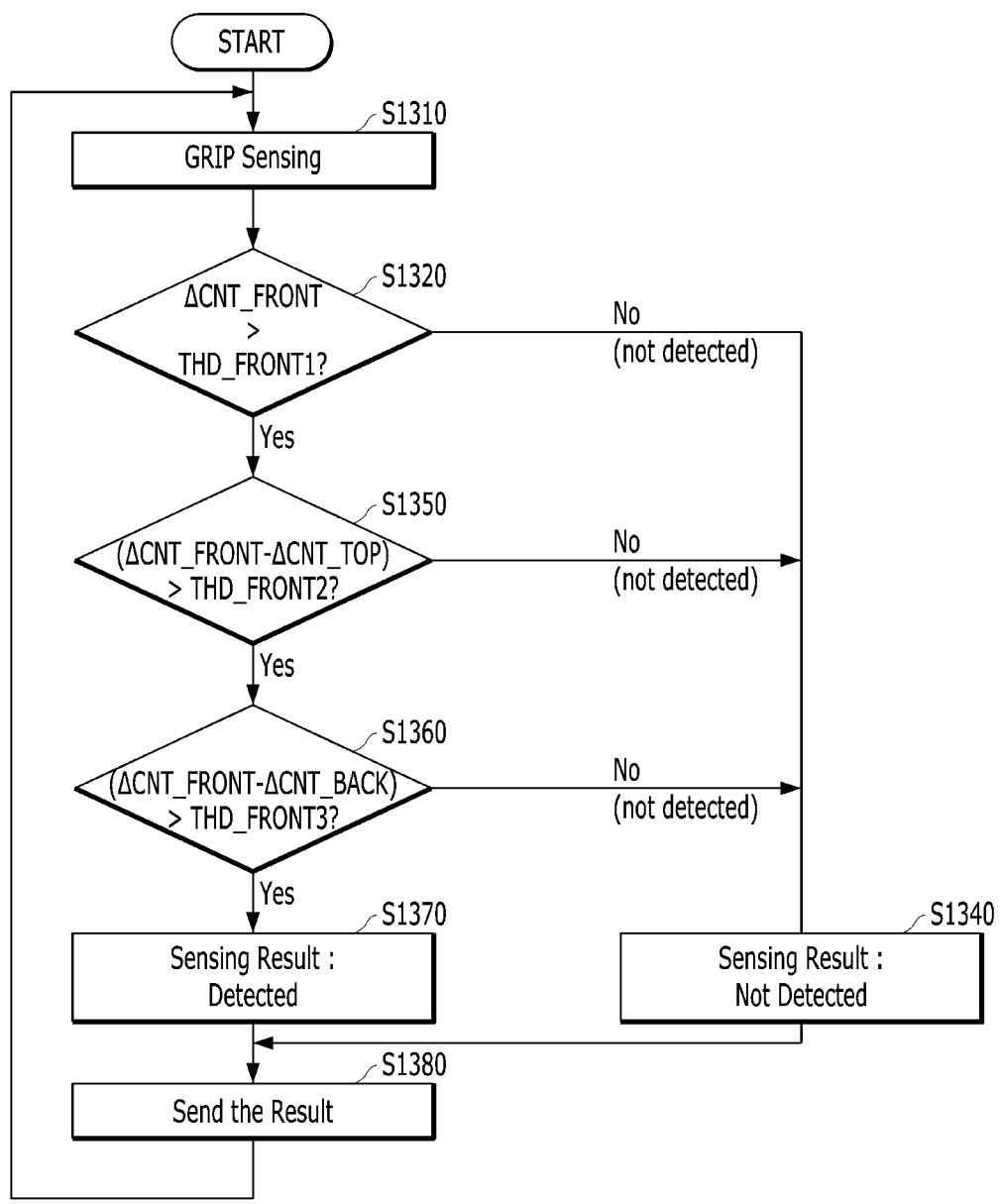
FIG. 13 is an operation flowchart showing a proximity sensing method for preventing a ghost touch phenomenon from occurring in the electronic device according to the other embodiment of the present invention.

FIG. 13 is an operation flowchart showing a proximity sensing method for preventing a ghost touch phenomenon from occurring in the electronic device according to the other embodiment of the present invention.

Since steps S1320 and 1350 are considerably similar to steps S820 and S850 of FIG. 8, redundant descriptions thereof will be omitted. Furthermore, a process in which step S1340 is performed due to the determination results of steps S1320 and S1350 is considerably similar to a process in which step S840 is performed due to the determination results of steps S820 and S850, and thus descriptions thereof will be omitted.

At step S1310, the third sensor 240 other than the first sensor 210 and the second sensor 220 may detect proximity detection-related third capacitance information.

When, as a result of the determination at step S1350, it is determined that first compensated sensing information (ΔCNT_FRONT−ΔCNT_TOP) is equal to or higher than a second threshold value THD_FRONT2 at step S1350, the processor 230 may generate second compensated sensing information (ΔCNT_FRONT−ΔCNT_BACK) by using the difference between the touch sensitivity value ΔCNT_FRONT of the first capacitance and the touch sensitivity value ΔCNT_BACK of the third capacitance at step S1360.

When the second compensated sensing information (ΔCNT_FRONT−ΔCNT_BACK) is lower than the third threshold value THD_FRONT3, the processor 230 may determine that the first capacitance results from disturbance or noise at step S1340. In contrast, when the second compensated sensing information (ΔCNT_FRONT−ΔCNT_BACK) is equal to or higher than the third threshold value THD_FRONT3, the processor 230 may determine that a human body or object is proximate to the first sensor 210 at step S1370. The processor 230 may transmit proximity information having passed through step S1370 to an AP at step S1380.

When the compensation of the first capacitance based on the third capacitance is performed, the coefficient of the third capacitance is determined based on an environmental parameter. The environmental parameter may be determined based on at least one of temperature, humidity, the area of the first sensor 210, and the area of the third sensor 220. Although an embodiment in which the second compensated sensing information (ΔCNT_FRONT−ΔCNT_BACK) is obtained based on the difference between the first capacitance and the third capacitance is shown in FIG. 13, compensated sensing information may be obtained based on the ratio between the first capacitance and the third capacitance in another embodiment of the present invention, as described above.

In some embodiments, in FIG. 13, at least one of the first threshold value THD_FRONT1, the second threshold value THD_FRONT2, and the third threshold value THD_FRONT3 may have a different value, and all the threshold values may have the same value.

As described above, the electronic device 200 according to the present invention can utilize capacitive proximity sensors, such as the first sensor 210, the second sensor 220 and the third sensor 240, in various directions beyond the level of the simple detection of the proximity of an object using a capacitive proximity sensor only in a single direction. Accordingly, whether or not a user actually grips the electronic device 200 can be accurately determined even when there is a disturbance factor or noise due to a surrounding environment.

Furthermore, the electronic device 200 according to the present invention can apply the detection result of the second sensor 220, which is a capacitive proximity sensor on a side surface, or the detection result of the third sensor 240, which is a capacitive proximity sensor on the rear surface, to the compensation of the detection result of the first sensor 210, which is a capacitive proximity sensor on the front surface. Accordingly, whether or not a user actually grips the electronic device 200 can be accurately determined without a need to apply a complicated/complexed pattern recognition algorithm or pattern analysis logic. Furthermore, the electronic device 200 according to the present invention can rapidly distinguish between a case where the capacitive proximity sensor on the front surface detects a change in capacitance due to a factor attributable to a surrounding environment or accidentally and a case where a user actually grips the electronic device 200 even at low cost and power consumption.

Furthermore, the electronic device 200 according to the present invention does not require complicated pattern recognition and can rapidly validate the operation of the proximity sensor, and thus response speed is fast and power consumption can be reduced.

As described above, according to the present invention, the electronic device according to the present invention uses the capacitive proximity sensor in place of an ambient light sensor or infrared sensor as a proximity sensor, and thus the area of a bezel can be further narrowed, thereby reducing design constraints.

Furthermore, according to the present invention, the electronic device according to the present invention can prevent erroneous touch operation by using the inexpensive capacitive proximity sensor without requiring an expensive ambient light sensor or infrared sensor, thereby reducing the manufacturing cost of a product.

Furthermore, according to the present invention, the electronic device according to the present invention can utilize the capacitive proximity sensors in various directions beyond the level of the simple detection of the proximity of an object using a capacitive proximity sensor only in a single direction, and thus whether or not a user actually grips the electronic device can be accurately determined even when there is a disturbance factor or noise due to a surrounding environment.

Furthermore, according to the present invention, the electronic device according to the present invention can apply the detection result of the capacitive proximity sensor on the side surface to the compensation of the detection result of the capacitive proximity sensor on the front surface, and thus whether or not a user actually grips the electronic device can be accurately determined without a need to apply a complicated pattern recognition algorithm or pattern analysis logic. Additionally, the electronic device according to the present invention can rapidly distinguish between a case where the capacitive proximity sensor on the front surface detects a change in capacitance due to a factor attributable to a surrounding environment or accidentally and a case where a user actually grips the electronic device 200 even at low cost and power consumption.

Moreover, according to the present invention, the electronic device according to the present invention does not require complicated pattern recognition and can rapidly validate the operation of the proximity sensor, and thus response speed is fast and power consumption can be reduced.

The method according to one embodiment of the present invention may be implemented in the form of program instructions, and may be then recorded in a computer-readable storage medium. The computer-readable storage medium may include program instructions, data files, and data structures solely or in combination. Program instructions recorded on the storage medium may have been specially designed and configured for the present invention, or may be known to or available to those who have ordinary knowledge in the field of computer software. Examples of the computer-readable storage medium include all types of hardware devices specially configured to record and execute program instructions, such as magnetic media, such as a hard disk, a floppy disk, and magnetic tape, optical media, such as compact disk (CD)-read only memory (ROM) and a digital versatile disk (DVD), magneto-optical media, such as a floptical disk, ROM, random access memory (RAM), and flash memory. Examples of the program instructions include machine code, such as code created by a compiler, and high-level language code executable by a computer using an interpreter. These hardware devices may be configured to operate as one or more software modules in order to perform the operation of the present invention, and the vice versa.

However, the present invention is not limited to the embodiments. Like reference symbols in the drawings designate like components. The lengths, heights, sizes, widths, etc. introduced in the embodiments and drawings of the present invention may be exaggerated to help understanding.

Although the present invention has been described with reference to specific details, such as the specific components, and the limited embodiments and drawings, these are provided merely to help a general understanding of the present invention, and the present invention is not limited thereto. Furthermore, those having ordinary knowledge and/or skill in the technical field to which the present invention pertains may make various modifications and variations from the above detailed description.

Therefore, the spirit of the present invention should not be defined based only on the described embodiments, and not only the attached claims but also all equivalent to the claims should be construed as falling within the scope of the spirit of the present invention.

What is claimed is:

1. An electronic device comprising:
   a first sensor arranged in a first area which is at least part of a non-display area of a front surface including a display, wherein the first sensor is configured to generate first sensing information based on a first capacitance sensed by the first sensor;
   a second sensor arranged in a first side surface adjacent to the first area, wherein the second sensor is configured to generate second sensing information based on a second capacitance sensed by the second sensor; and
   a processor configured to:
      in response to the first sensing information being less than a first threshold value, determine that there is no touch or gesture operation of a user in front of the front surface and that there is no touch or gesture operation of the user proximate to the first sensor;
      in response to the first sensing information being equal to or greater than the first threshold value, generate first compensated sensing information by subtracting the second sensing information from the first sensing information or generate first alternative compensated sensing information by dividing the first sensing information by the second sensing information;
      in response to the first compensated sensing information being less than a second threshold value or the first alternative compensated sensing information being less than a second alternative threshold value, determine that there is no touch or gesture operation of the user proximate to the first sensor and that the first sensing information has been affected by a parasitic capacitance due to the presence of a second object proximate to the first side surface, which has been canceled in the first compensated sensing information or the first alternative compensated sensing information by using the second sensing information; and
      in response to the first compensated sensing information being equal to or greater than the second threshold value or the first alternative compensated sensing information being equal to or greater than the second alternative threshold value, determine that a first object is proximate to the first sensor, wherein the first object corresponds to a touch or gesture operation of the user,
   wherein the first side surface is directed to a direction different from a direction to which the front surface including the display is directed.

2. The electronic device of claim 1, wherein:
   the first sensor comprises:
      a first electrode formed along a first direction included in the front surface; and
      a second electrode formed along a second direction included in the front surface and intersecting the first direction; and
   the second sensor comprises:
      a third electrode formed along the first direction included in the first side surface, the first direction is also included in the front surface; and
      a fourth electrode formed along a third direction included in the first side surface and intersecting the first direction.

3. The electronic device of claim 1, further comprising:
a third sensor arranged on a rear surface opposite to the front surface, wherein the third sensor is configured to generate third sensing information based on a third capacitance between a third object in front of the rear surface and the third sensor,
wherein the processor is further configured to generate second compensated sensing information or second alternative compensated sensing information based on the first sensing information and the third sensing information.

4. The electronic device of claim 3, wherein the processor is further configured to:
in response to the first compensated sensing information being less than the second threshold value or the first alternative compensated sensing information being less than the second alternative threshold value, determine that there is no proximate object;
in response to the first compensated sensing information being equal to or greater than the second threshold value or the first alternative compensated sensing information being equal to or greater than the second alternative threshold value, generate the second compensated sensing information by subtracting the third sensing information from the first sensing information or generate the second alternative compensated information by dividing the first sensing information by the third sensing information;
in response to the second compensated sensing information being less than a third threshold value or the second alternative compensated sensing information being less than a third alternative threshold value, determine that the first sensing information has been affected by a noise; and
in response to the second compensated sensing information being equal to or greater than the third threshold value or the second alternative compensated sensing information being equal to or greater than the third alternative threshold value, determine that the first object is proximate to the first sensor.

5. The electronic device of claim 1, wherein:
the processor determines a coefficient, to which the second sensing information is applied, based on an environmental parameter when the first compensated sensing information is generated; and
the environmental parameter is determined based on at least one of temperature, humidity, an area of the first sensor, or an area of the second sensor.

6. A proximity sensing method, the proximity sensing method being performed in an electronic device, the proximity sensing method comprising:
generating, by a first sensor arranged in a first area which is at least part of a non-display area of a front surface including a display, first sensing information based on a first capacitance sensed by the first sensor;
generating, by a second sensor arranged in a first side surface adjacent to the first area, second sensing information based on a second capacitance sensed by the second sensor;
in response to the first sensing information being less than a first threshold value, determining, by a processor, that there is no touch or gesture operation of a user in front of the front surface and that there is no touch or gesture operation of the user proximate to the first sensor;
in response to the first sensing information being equal to or greater than the first threshold value, generating, by the processor, first compensated sensing information by subtracting the second sensing information from the first sensing information or generating, by the processor, first alternative compensated sensing information by dividing the first sensing information by the second sensing information;
in response to the first compensated sensing information being less than a second threshold value or the first alternative compensated sensing information being less than a second alternative threshold value, determining, by the processor, that there is no touch or gesture operation of the user proximate to the first sensor and that the first sensing information has been affected by a parasitic capacitance due to the presence of a second object proximate to the first side surface, which has been canceled in the first compensated sensing information or the first alternative compensated sensing information by using the second sensing information; and
in response to the first compensated sensing information being equal to or greater than the second threshold value or the first alternative compensated sensing information being equal to or greater than the second alternative threshold value, determining, by the processor, that a first object is proximate to the first sensor, wherein the first object corresponds to a touch or gesture operation of the user,
wherein the first side surface is directed to a direction different from a direction to which the front surface including the display is directed.

7. The proximity sensing method of claim 6, further comprising:
generating, by a third sensor arranged on a rear surface opposite to the front surface, third sensing information based on a third capacitance between a third object in front of the rear surface and the third sensor; and
generating, by the processor, second compensated sensing information or second alternative compensated sensing information based on the first sensing information and the third sensing information.

8. The proximity sensing method of claim 7, wherein:
in response to the first compensated sensing information being less than the second threshold value or the first alternative compensated sensing information being less than the second alternative threshold value, determining, by the processor, that there is no proximate object;
in response to the first compensated sensing information being equal to or greater than the second threshold value or the first alternative compensated sensing information being equal to or greater than the second alternative threshold value, generating, by the processor, the second compensated sensing information by subtracting the third sensing information from the first sensing information or generating, by the processor, the second alternative compensated sensing information by dividing the first sensing information by the third sensing information;
in response to the second compensated sensing information being less than a third threshold value or the second alternative sensing information being less than a third alternative threshold value, determining, by the processor, that the first sensing information has been affected by a noise; and in response to the second compensated sensing information being equal to or greater than the third threshold value or the second alternative compensated sensing information being equal to or greater than the third alternative threshold value, determining, by the processor, that the first object is proximate to the first sensor.

\* \* \* \* \*